(12) United States Patent
Watanabe et al.

(10) Patent No.: US 6,174,192 B1
(45) Date of Patent: *Jan. 16, 2001

(54) CARD CONNECTOR

(75) Inventors: Satoru Watanabe, Tokyo; Hidenori Muramatsu, Kanagawa, both of (JP)

(73) Assignee: The Whitaker Corporation, Wilmington, DE (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/143,570

(22) Filed: Aug. 28, 1998

(30) Foreign Application Priority Data

Aug. 29, 1997 (JP) .................................................. 9-249853
Apr. 6, 1998 (JP) .................................................. 10-092135

(51) Int. Cl.[7] ..................................................... H01R 13/64
(52) U.S. Cl. ............................................................. 439/377
(58) Field of Search ............................. 439/64, 377, 159, 439/570, 571, 572, 62, 329, 567

(56) References Cited

U.S. PATENT DOCUMENTS 5,290,174   3/1994   Woratyla et al. ...................... 439/59
5,297,966   3/1994   Brennian, Jr. et al. ................ 439/64
5,389,001 * 2/1995   Broschard, III et al. .............. 439/64

* cited by examiner

Primary Examiner—Paula Bradley
Assistant Examiner—Antoine Ngandjui

(57) ABSTRACT

The present invention provides a card connector which, while being relatively compact for a card connector includes a connector member and arm members, is equipped with an engaging means for both members which has sufficient engaging strength. Card connector (10) has a connector member (11) which has a housing (20) in which electrical contacts are accommodated, a pair of arm members (12, 13), which are mounted on both ends of the connector member (11), and which include guide means. The connector (11) and arm members (12, 13) include engaging structures (25, 26, 56, 57), which are engaged so that portions of the connector member (11) and arm members (12, 13) overlap with each other. Screw-accommodating holes (26a, 57a) and pin-accommodating holes (25a, 56a), which pass through both arm members when the members are engaged are located in the engaging structures of both members. The respective members are held by pins in the pin-accommodating holes (25a, 56a); then, when the assembly is mounted on a circuit board, screws are accommodated in the screw-accommodating holes (26a, 57a). By means of the screws, the card connector (10) is fastened to the circuit board, and the connector member (11) and arm members (12, 13) are firmly fastened to each other.

13 Claims, 9 Drawing Sheets

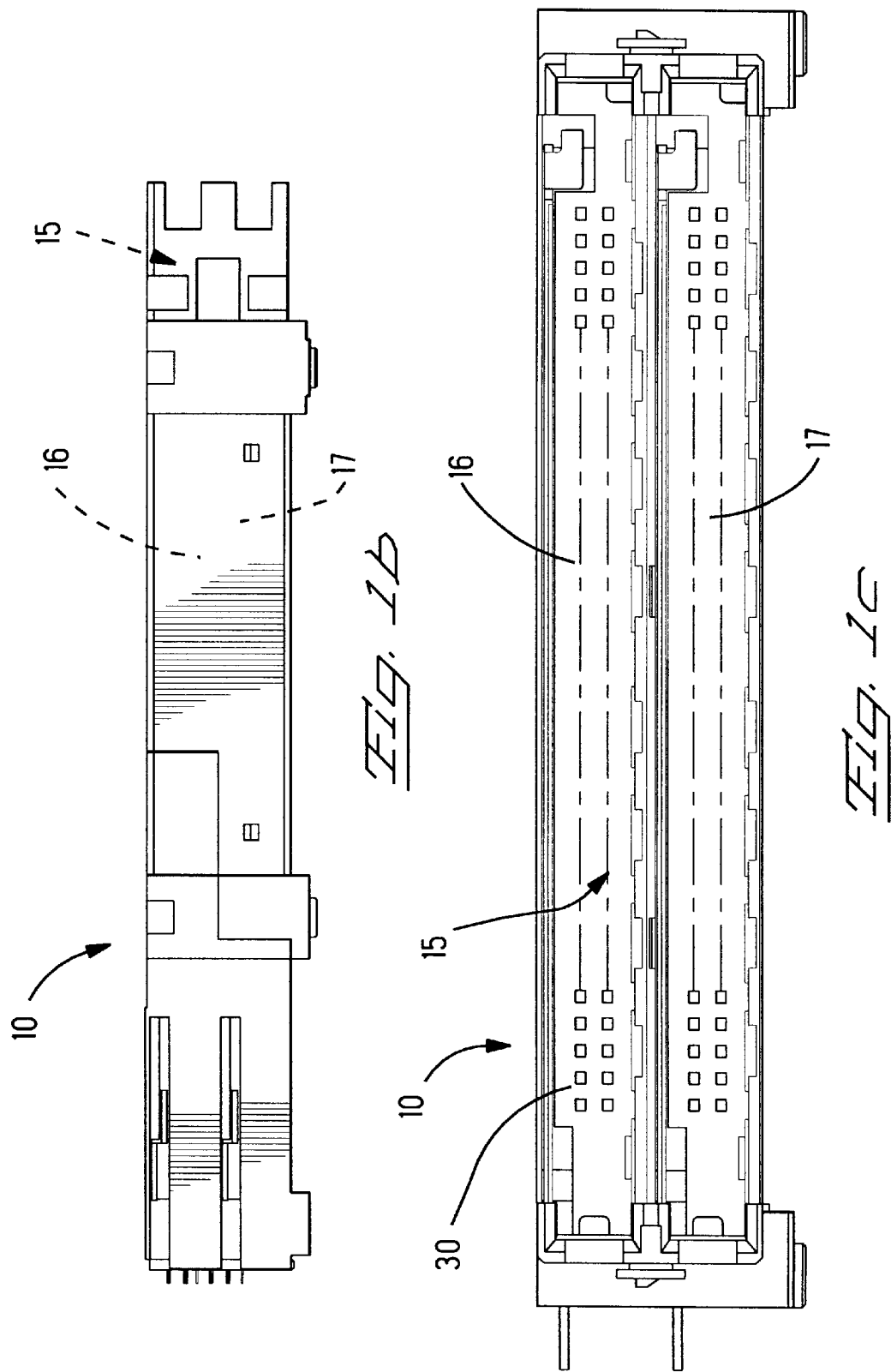

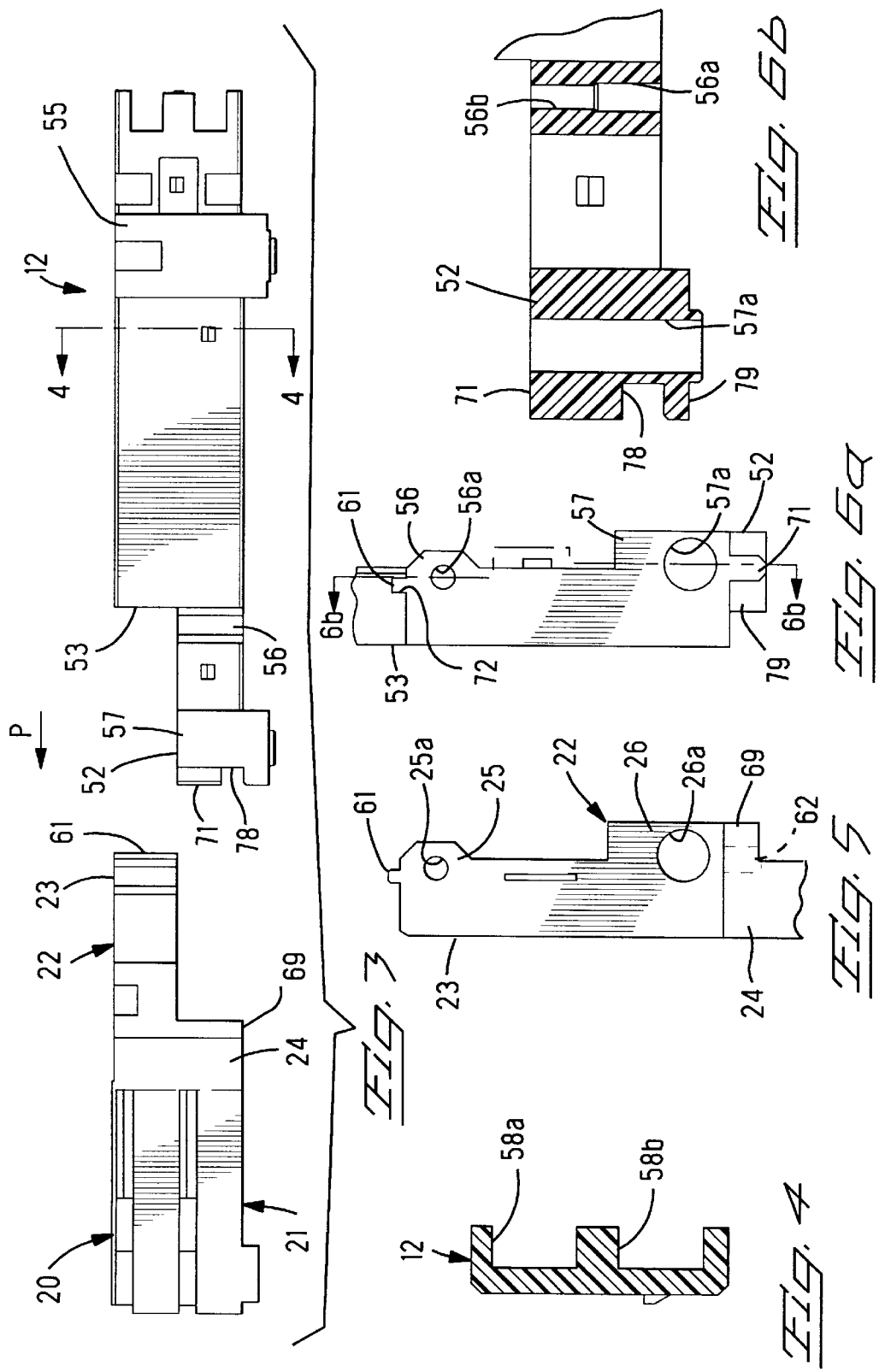

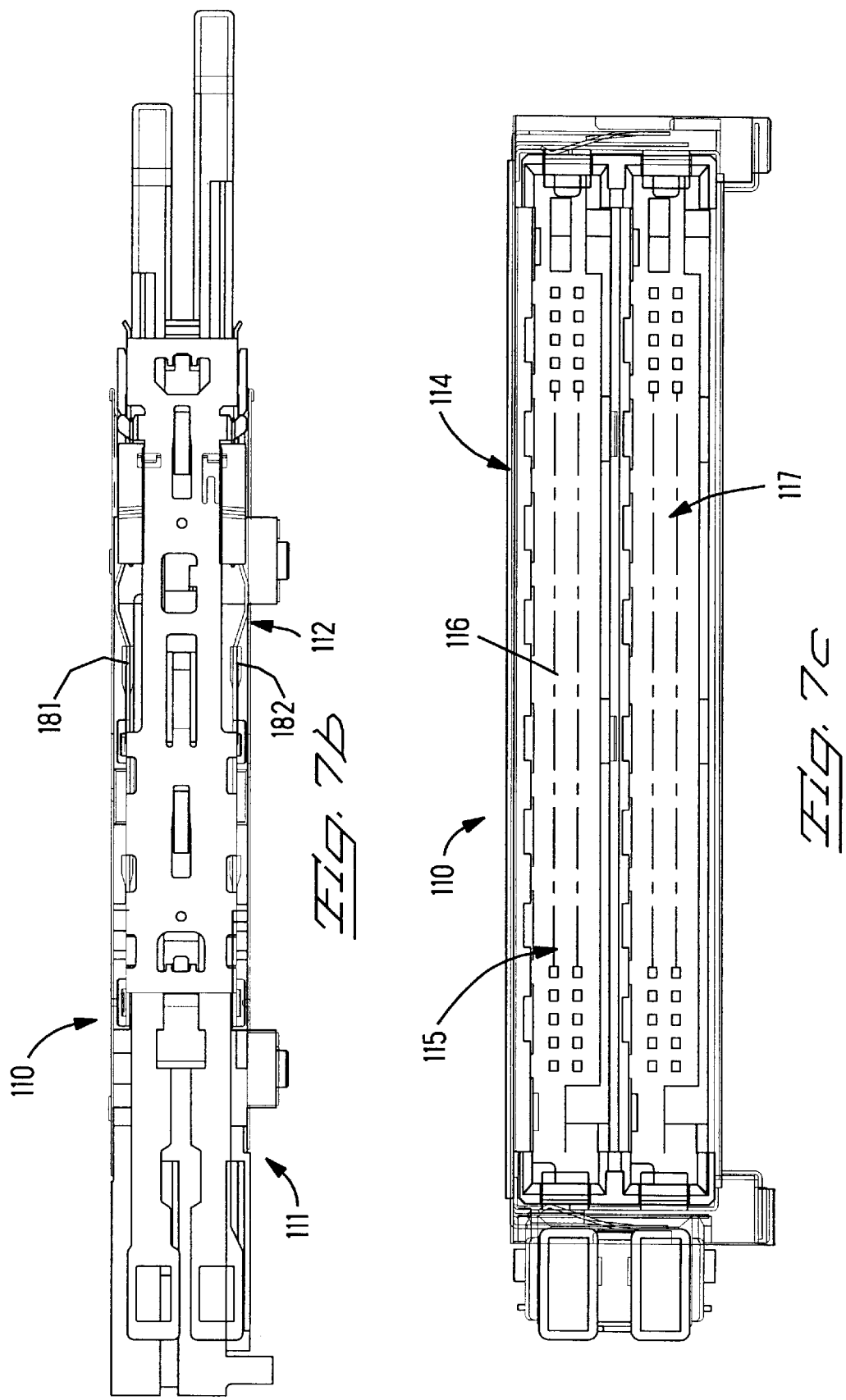

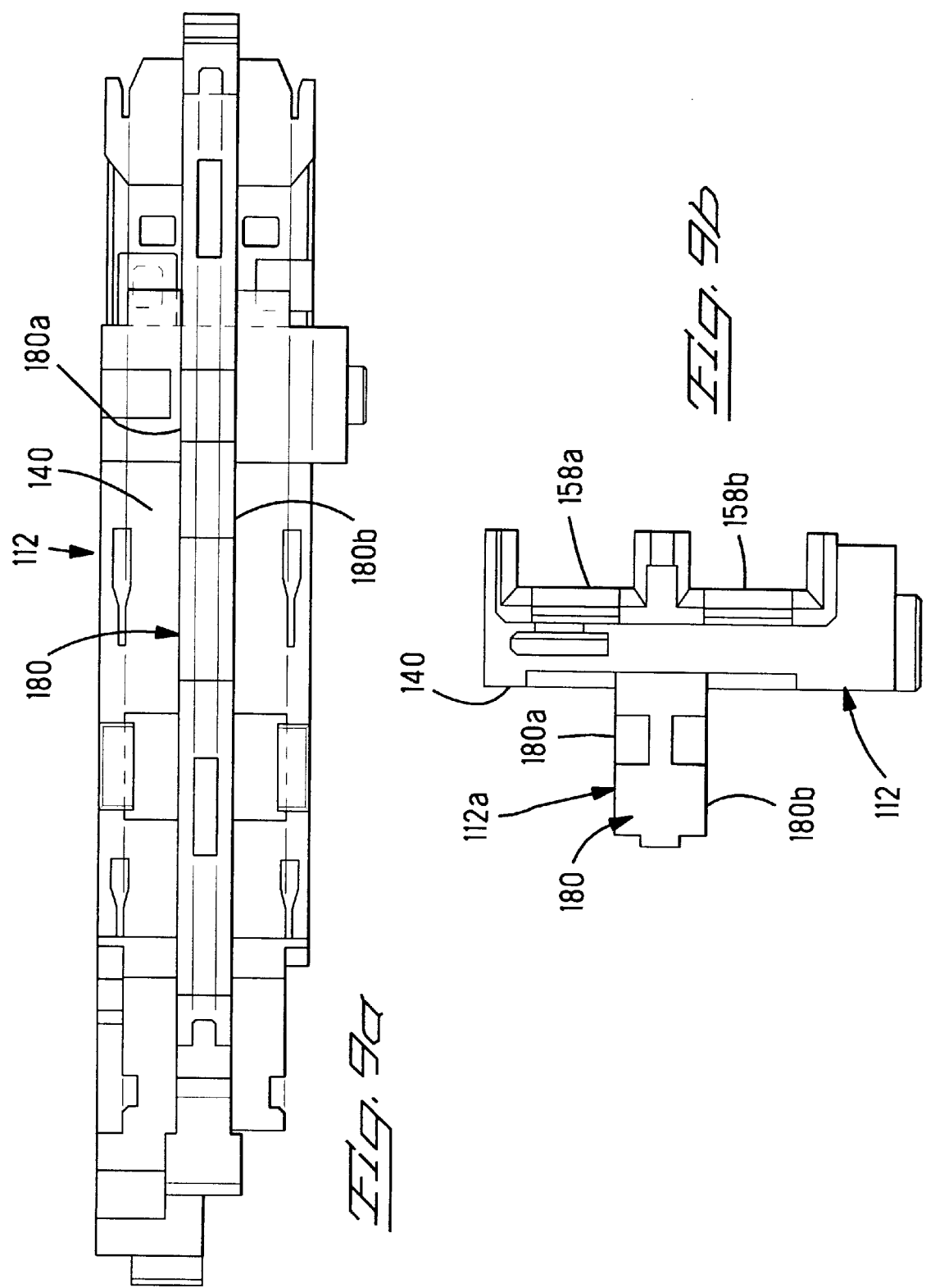

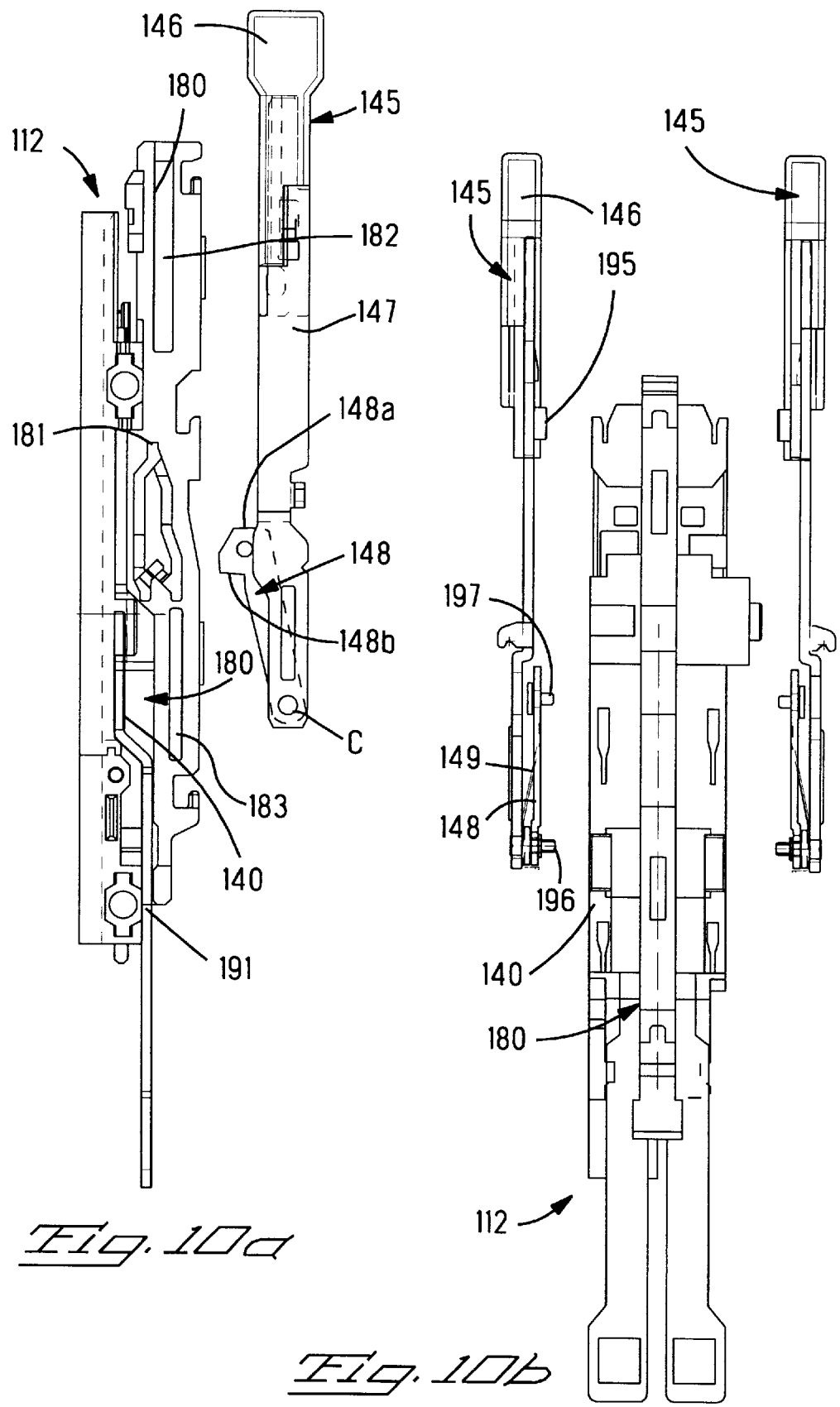

CARD CONNECTOR

FIELD OF THE INVENTION

The present invention relates to a card connector, and more specifically relates to a card connector for mounting on a circuit board and for accommodating cards along a direction that is substantially parallel to the circuit board.

BACKGROUND OF THE INVENTION

A conventional card connector disclosed in Japanese Patent Application No. 6-208874 and in U.S. Pat. No. 5,297,966 includes a connector member having a plurality of pin terminals used for electrical connection with a memory card, and a housing accommodating the terminals, and card-guiding arm members connected to the connector member. Engaging fingers which engage with grooves in the connector member are on inner ends of the arm members, so that the arm members can be latch-engaged with the connector member. In this way, the respective parts of the card connector can easily be manufactured, and the assembly of the parts can also be accomplished in a relatively simple manner.

In recent years, card connectors of the type described above have been used in applications such as notebook computers; in such applications, however, there is a need to minimize the dimensions of the card connector. Since the latch engagement means described above has relatively large dimensions, size reduction requirements cannot be satisfied.

Accordingly, an object of the present invention is to provide a card connector, which, while being relatively compact for a card connector, includes a connector member and arm members, and it is equipped with engaging means for both members, the engaging means having sufficient engaging strength.

SUMMARY OF THE INVENTION

The present invention is directed to a circuit board-mounted card connector comprising a connector member having a housing accommodating a plurality of electrical terminals that can be electrically connected to a memory card, and a pair of arm members connected to the connector member for guiding the card into the connector member, at least one connecting means for connecting the arm members and the connector member located in the area of connection between the arm members and connector member which also operates as a fastening means for fastening to the circuit board.

Preferably, the connecting means includes screw-fastening means and pin-fastening means. It is desirable that the pin-fastening means hold the connector member and the arm members together until the card connector is fastened to the circuit board. Preferably, the screw-fastening means and pin-fastening means are aligned in the direction of length of the arm members.

The connector member and arm members have an engaging structure which is constructed so that the connector member and arms members engage with each other in a direction of height. It is advisable that the engaging structure be offset in the direction of height on respective sides of the connector member and arm members, and that the structure be formed with complementary shapes. It is advisable that the card connector be constructed so that two cards can be accommodated in the direction of height, and that the offset structures of the engaging structure be disposed in positions corresponding to the respective card-accommodating sections.

The screw-fastening means and pin-fastening means are disposed in the engaging structures of the connector member and arm members. It is advisable that the respective engaging structures of the connector member and arm members include screw-accommodating holes and pin-accommodating holes which respectively communicate when the respective members are engaged.

The engaging structures of the connector member and arm members are provided with at least one set of recessed and protruding parts, which engage with each other so that positional deviations in the horizontal direction and vertical direction are prevented.

Furthermore, the present invention is directed to a card connector in which a connector member contains a connecting section for connection to a memory card, and a pair of facing arm members extending from the connector member, which include guide means that guide the card into the connecting section. The card connector constitutes two card-accommodating sections that are capable of accommodating two cards so that the cards are stacked in the direction of height, and also it includes ejection members which are used to eject the individual cards accommodated in the card-accommodating sections, the connector member and the pair of facing arm members respectively form portions of the two card-accommodating sections by means of single members, and the ejection members corresponding respectively to the two card-accommodating sections are operationally mounted to one of the pair of facing arm members.

The one arm member to which the ejection members are mounted has a horizontal wall which extends to an outside from an outside surface.

A cam means, which engages with a sliding body that is caused to slide for purposes of the card-ejection operation and which performs a cam operation with respect to at least some parts of the sliding body, is disposed on both opposite surfaces of the horizontal wall.

A guide means, which engages with a sliding body that is caused to slide for purposes of the card-ejection operation and which is used to guide the sliding motion of the sliding body, is disposed on both opposite surfaces of the horizontal wall.

The horizontal wall extends from an intermediate position located between the two card-accommodating sections that are stacked in the direction of height.

BRIEF DESCRIPTION OF THE DRAWINGS

Embodiments of the present invention will now be described by way of example with reference to the accompanying drawings in which:

FIGS. 1a–1c show an assembled card connector of the present invention with FIG. 1a being a top plan view, FIG. 1b is a view as seen from the direction indicated by arrow X in FIG. 1a, and FIG. 1c is a front view as seen from the direction indicated by arrow Y in FIG. 1a.

FIG. 3 shows a side view of the connector member and arm members in the state prior to connection as seen from the direction indicated by arrow Z in FIG. 2.

FIG. 4 is a cross-sectional view of the arm member taken along the line 4—4 in FIG. 3.

FIG. 5 is a part-enlarged view of the construction in the vicinity of the front end of a protruding section on one side of a housing of the connector member as seen from the bottom surface thereof.

FIGS. 6a and 6b illustrate the area in the vicinity of a rear end of one of the arm members with FIG. 6a being a part-enlarged top plan view, and FIG. 6b is a longitudinal cross section taken along line 6b—6b in FIG. 6a in which the first rear end portion is partly enlarged.

FIGS. 7a–7c illustrate an alternative embodiment of the card connector with FIG. 7a being a top plan view, FIG. 7b is a view from the direction indicated by arrow X in FIG. 7a, and FIG. 7c is a front view.

FIGS. 9a and 9b show the arm member main body which includes an ejection mechanism with FIG. 9a being a view from the direction indicated by arrow X in FIG. 8, and FIG. 9b is a view from the direction indicated by arrow Y in FIG. 9a.

FIGS. 10a and 10b show the assembly of the parts used to form the ejection mechanism with respect to a horizontal wall with FIG. 10a being a plan view, and FIG. 10b is a side view.

DETAILED DESCRIPTION OF THE INVENTION

Figure 1A:
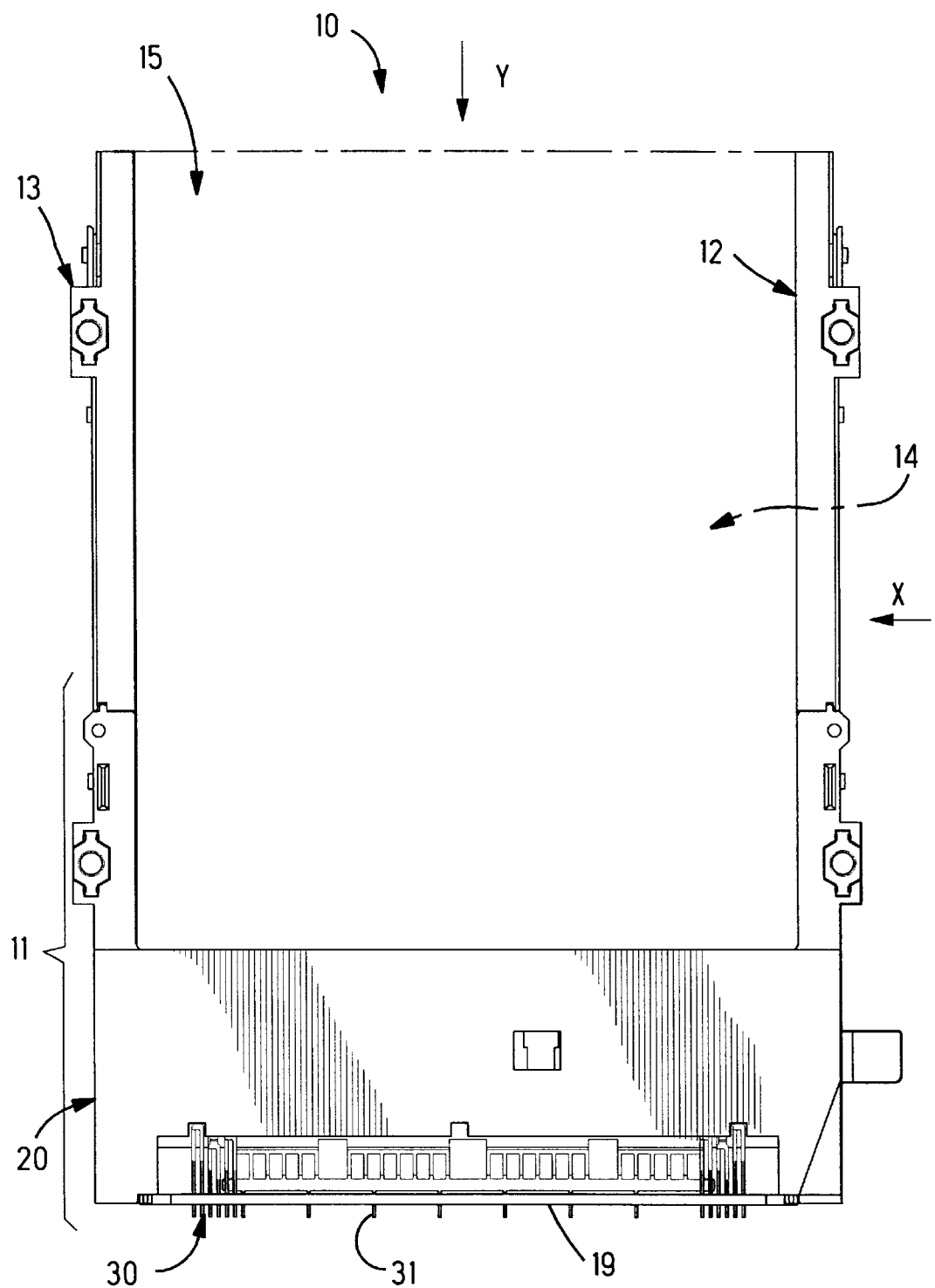

In FIGS. 1a–1c, the card connector 10 includes a connector member 11 comprising a housing 20 accommodating a plurality of electrical terminals 30, which can be electrically connected to a memory card, a pair of arm members 12, 13, which are disposed so that they extend from both side edges of the connector member 11, and a metal frame 14, which is disposed so that it forms a bridge between the arm members 12, 13. The card connector 10 is to be mounted on a circuit board (not shown). The plurality of electrical terminals 30 include connecting sections 31, which are electrically connected to a daughter board 19 that is to be connected to the circuit board on which the card connector 10 is mounted.

The housing 20 and arm members 12, 13 of the connector member 11 are formed as separate parts by molding a suitable resin material, and they are connected to each other and fastened to the circuit board by connecting means which will be described later. Since the arm members 12, 13 and connector member 11 are formed from a resin material, the card connector 10 can be manufactured relatively inexpensively. A card-accommodating member 15 is delineated by the arm members 12, 13 and the frame 14. As seen from FIG. 1c, the card-accommodating member 15 has a first card-accommodating section 16 on an upper side and a second card-accommodating section 17 on the lower side, each of which allows the insertion of a relatively thin card. Furthermore, the metal frame 14 is grounded and connected to the circuit board (not shown) by means of a metal fitting positioned on an end portion.

Figure 2:
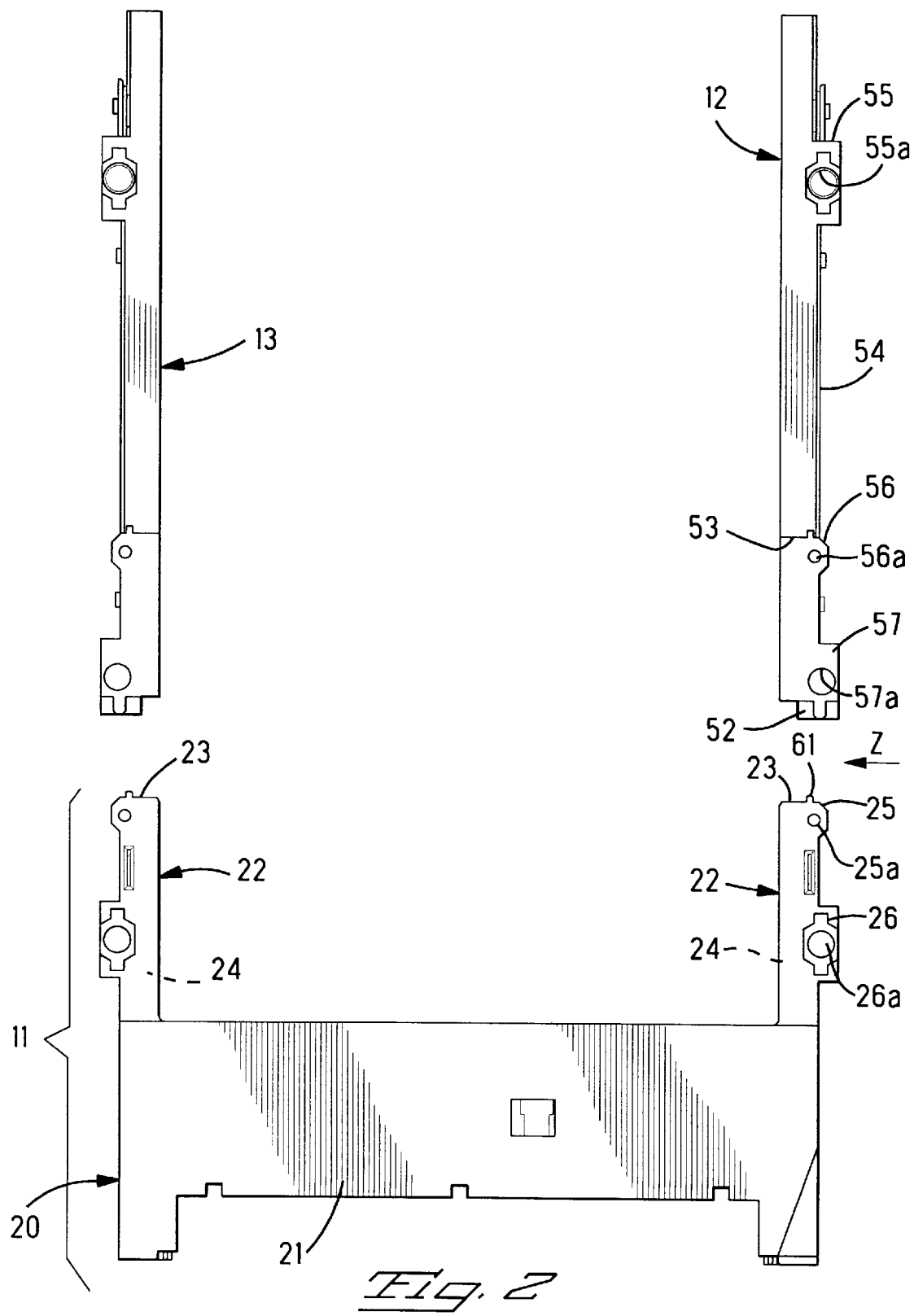
FIG. 2 is a top plan view showing a connector member and arm members in a state prior to connection to each other.

As shown in FIGS. 2 and 3, the housing 20 of the connector member 11 has a base section 21 and a pair of protruding members 22 which protrude to one side from both ends of the base section 21. Although not shown, the terminals 30 are disposed inside the base section 21. Each protruding member 22 has a first portion 23, which protrudes in a forward direction, and a second portion 24, which terminates at a rear end thereof. The first portion 23 protrudes in the forward direction at a height position corresponding to the first card-accommodating section 16 of the card-accommodating member 15 (i.e., the upper position). The second portion 24 is disposed at a height position which corresponds to the second card-accommodating section 17 (i.e., the lower position). As will be described later, the first portion 23 has a pin-fastening section 25 including a pin-accommodating hole 25a which accommodates a pin that allows fastening of the arm member 12, and a screw-fastening section 26 including a screw-accommodating hole 26a that accommodates a screw which is used in conjunction with the pin-fastening section 25 to fasten the arm member 12 and housing 20 together while fastening both thereof to the circuit board.

Furthermore, as shown in FIGS. 2 and 3, the pair of arm members 12, 13 are formed with mirror-symmetrical shapes. Accordingly, the structure of these arm members will be described using the arm member 12. The arm member 12 has a first rear end portion 52 which protrudes rearward, and a second rear end portion 53 which terminates at a point forward of the first rear portion 52. As shown in FIG. 3, the first rear end portion 52 is disposed at a height position which corresponds to the second card-accommodating section 17 (i.e., the lower position), while the second rear end portion 53 is disposed at a height position which corresponds to the first card-accommodating section 16 (i.e., the upper position) (see FIG. 1). Furthermore, a first screw-fastening section 55, which includes a screw-accommodating hole 55a in which a screw that is used to fasten the arm member 12 to the circuit board is accommodated, is formed in a relatively forward position on an outside surface 54 of the arm member 12. Moreover, a first pin-fastening section 56, which includes a pin-accommodating hole 56a that accommodates a pin used to hold the arm member 12 on the housing 20 (as will be described later), and a second screw-fastening section 57 including a screw-accommodating hole 57a that accommodates a screw, which is used in conjunction with the first pin-fastening section 56 to fasten the arm member 12 and housing 20 together while fastening both thereof to the circuit board, are formed side-by-side on the first rear end portion 52. The first pin-fastening section 56 is positioned within the first rear end portion 52 near the boundary with the second rear end portion 53, while the second screw-fastening section 57 is positioned in the vicinity of the rear end of the first rear end portion 52. As shown in FIGS. 3–6, the first and second screw-fastening sections 55 and 57 and the first pin-fastening section 56 protrude slightly outward from the outside surface 54 of the arm member 12. Furthermore, as shown in FIG. 4, a pair of grooves 58a, 58b are located in the inside surface of the arm member 12. When the arm members 12, 13 are assembled with the housing 20, the grooves 58a, 58b act in conjunction with a pair of grooves formed in the inside surface (not shown) of the protruding members 22 of the housing 20 (described later) to guide the insertion of the card therealong.

As seen in FIG. 5, a protruding rib 61 is located on a front end of the first portion 23 of the protruding member 22. As seen from FIG. 3, protruding rib 61 extends linearly across the height dimension of the first portion 23. Furthermore, a slot 62 is located in the second portion 24 of the protruding member 22. Although not shown in detail in FIG. 3, the slot 62 extends to a height position corresponding to the second portion 24, but it is terminated by a wall 69 as shown in FIG. 3. It should be noted that the protruding rib 61 is disposed in the vicinity of the pin-accommodating hole 25a of the pin-fastening section 25, and that the slot 62 is disposed in the vicinity of the screw-accommodating hole 26a of the screw-fastening section 26.

As shown in FIGS. 6a and 6b, the fact that the first rear end portion 52 of the arm member 12 has a second screw-fastening section 57, which includes a screw-accommodating hole 57a that is a through-hole, and a pin-fastening section 56, which includes a pin-accommodating hole 56*a* that is also a through-hole, is shown in greater detail. As shown in FIG. 6*b*, the pin-accommodating hole 56*a* includes a small-diameter portion 56*b*, which is used to hold the pin by press-fitting therein, and a protruding rib 71 is located on the rear end of the first rear end portion 52. As seen from FIG. 6*b*, the protruding rib 71 extends linearly in the height direction, and has a length dimension that is smaller than the height of the first rear end portion 52. A recess 78 is delineated between the protruding rib 71 and a wall 79. The protruding rib 71 is disposed in the vicinity of the screw-accommodating hole 57*a* of the second screw-fastening section 57. Furthermore, as shown in FIG. 6*a*, a groove 72, which extends in the height direction, is located in the rear side of the second rear end portion 53. Although details are not shown in FIG. 6*a*, the groove 72 is formed so that it extends substantially across the second rear end portion 53 in the direction of height.

Referring again to FIGS. 2 and 3, the pair of arm members 12, 13 are moved in the direction indicated by arrow P with respect to the housing 20 in order to assemble the card connector 10. Although not shown, a plurality of electrical terminals are accommodated beforehand in the housing 20 in the case of actual assembly (see FIG. 1). As a result of the relative movement of the arm members 12, 13, the first rear end portions 52 of the arm members 12, 13 are caused to overlap with the protruding members 22 of the housing 20. The positioning of members at the time of this overlapping may be best understood by referring to FIG. 1, which shows the state following the completion of assembly of the card connector. In this case, as shown in FIG. 3, the first rear end portions 52 are positioned at the bottom side, i.e., the circuit board side when the card connector 10 is mounted on a circuit board. As will be seen by reference to both FIGS. 5 and 6, when these parts overlap, the protruding ribs 71 on the first rear end portions 52 of the arm members 12, 13 engage with the slots 62 in the protruding members 22 of the housing 20, and the grooves 72 in the second rear end portions 53 engage with the protruding ribs 61 on the protruding members 22. In this case, the recesses 78 adjacent to the protruding ribs 71 accommodate the walls 69 of the housing 20. In this way, the arm members 12, 13 can be accurately positioned with respect to the connector member 11. The protruding ribs 71 and the slots 62, the grooves 72 and the protruding ribs 61, and walls 69 and recesses 78, have complementary width dimensions; accordingly, the arm members 12, 13 and the housing 20 are engaged in a state in which there is no looseness.

When the arm members 12, 13 and the housing 20 are accurately engaged, the pin-accommodating holes 56*a* and screw-accommodating holes 57*a* in the first rear end portions 52 of the arm members 12, 13 communicate respectively with the pin-accommodating holes 25*a* and screw-accommodating holes 26*a* in the protruding members 22 of the housing 20. As a result, the aligned respective holes can accommodate the corresponding pins and screws.

The arm members 12, 13 and the housing 20 of the connector member 11, which are thus partly overlapped and engaged with each other, are temporarily held together by mounting pins. These pins (not shown) extend substantially through at least the pin-accommodating holes 25*a* and pin-accommodating holes 56*a*, and are engaged in these pin-accommodating holes so that the arm members 12, 13 are prevented from coming loose from the housing 20 of the connector member 11. Afterward, the frame 14 and other small metal parts are mounted on the connector member 11 and arm members 12, 13. The strength with which the connector member 11 and arm members 12, 13 are held by the pins is set at a value which is sufficient to prevent the respective members from coming apart during assembly.

The card connector 10, which has been assembled as described above, is mounted on a circuit board (not shown). In this case, screws (not shown) are accommodated so that the screws are screw-engaged in the respective aligned screw-accommodating holes 57*a*, 26*a* of the screw-fastening sections 56 of the arm members 12, 13 (which are located in relatively forward positions) and the screw-fastening sections formed by the joint action of the second screw-fastening sections 57 of the arm members 12, 13 (which are located in relatively rearward positions) and the screw-fastening sections 26 of the connector member 11, so that the card connector 10 is firmly fastened to the circuit board by the screws. An important point here is that the rearward screw-fastening mechanisms provided by the joint action of the arm members 12, 13 and the connector member 11 fasten the card connector 10 to the circuit board, and also act so that the connector member 11 and arm members 12, 13 are firmly fastened to each other. Accordingly, a sufficient fastening strength for both members can be obtained, with the fastening by means of pins being used only as a temporary holding measure, and with the fastening by means of screws being used for the purpose of complete fastening of the members to the circuit board.

Figure 7A:
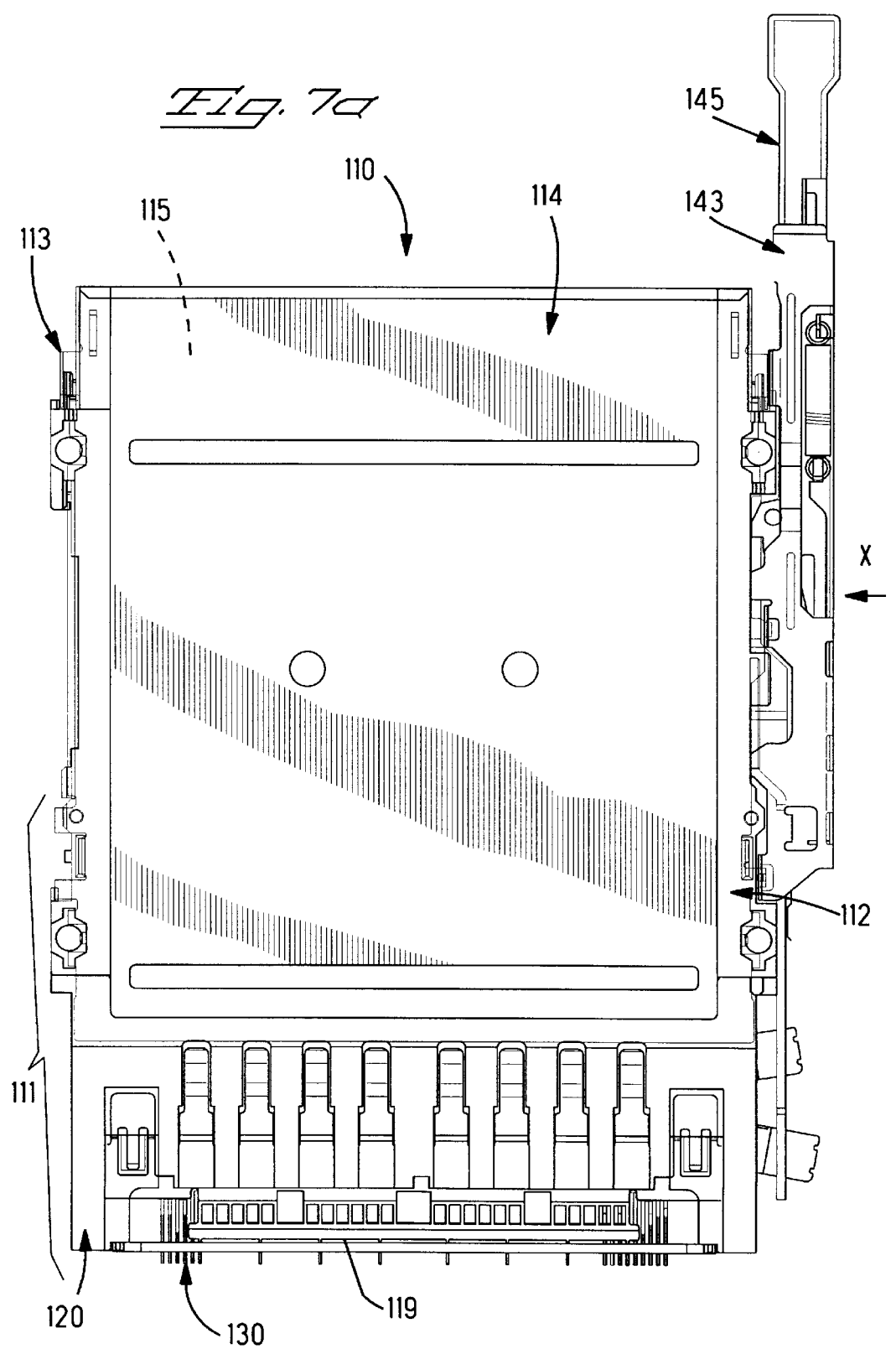
Figure 8:
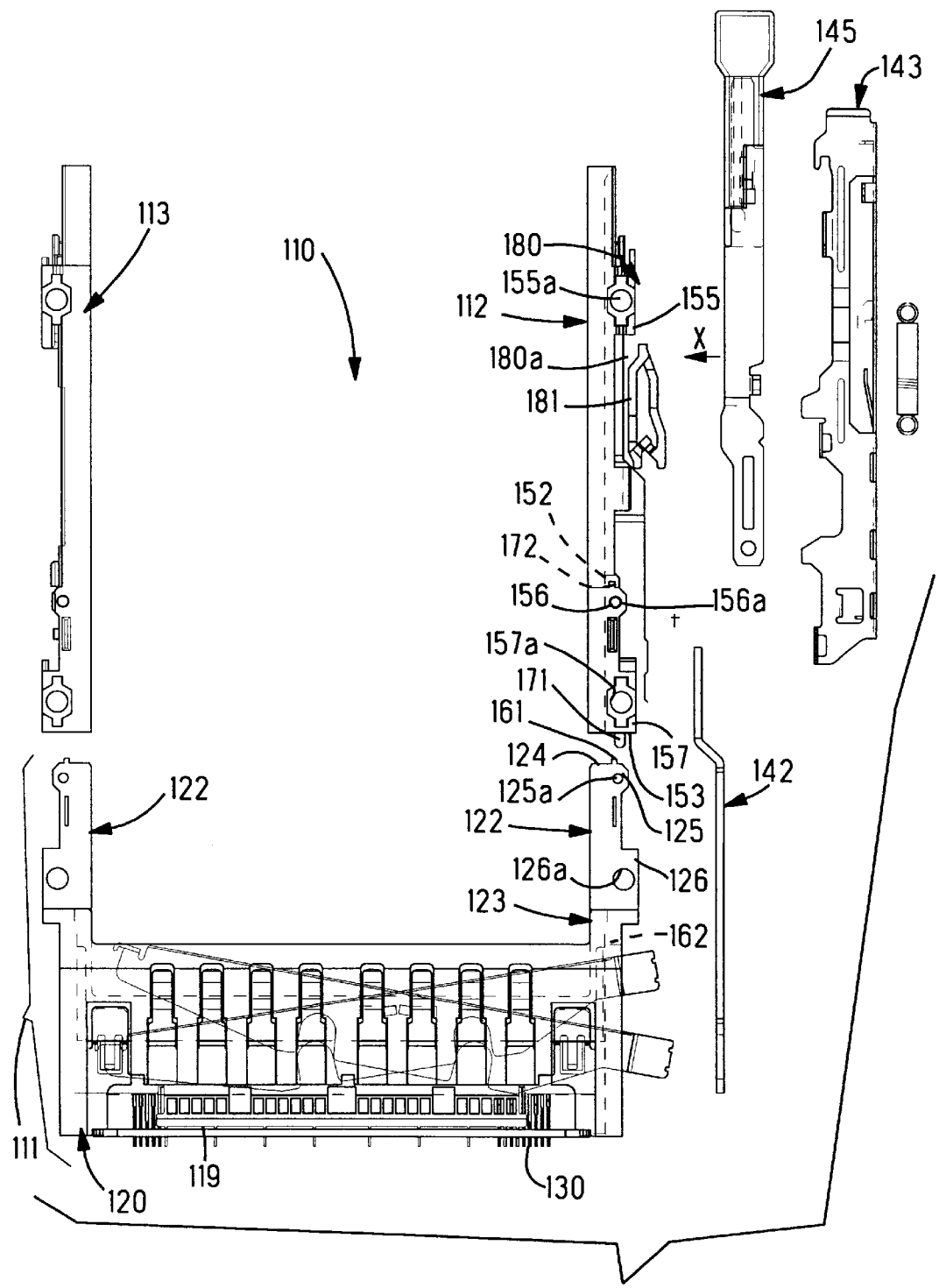
FIG. 8 is a top plan view in which the respective parts of the card connector shown in FIG. 7 are exploded.

As shown in FIGS. 7 and 8, the card connector 110 also includes three resin-molded parts including a connector member 111 and a pair of arm members 112, 113, and further includes a metal frame 114 which is superimposed and attached so that the metal frame 114 spans the area between the arm members 112, 113. These parts act in conjunction to delineate a card-accommodating member 115. As in the embodiment described above in FIGS. 1–6, the card-accommodating member 115 has a first card-accommodating section 116 and a second card-accommodating section 117, which are stacked in the direction of height so that each card-accommodating section can accommodate a relatively thin memory card. A daughter board 119 is accommodated in the connector member 111, and it is connected to a plurality of electrical terminals 130 which are disposed so that the terminals 130 pass through connector housing 120. The arm member 112 includes an ejection mechanism which ejects the cards as will be described below; the ejection mechanism includes operating members 145 and a frame member 143 which holds the operating members 145 and applies biased sliding operation to the operating members 145.

The arm members 112, 113 are attached to the connector member 111 by the same method as in the previous embodiment. As shown in FIG. 8, the arm members 112, 113 each has a second rear end portion 153, which terminates at the height position of the first card-accommodating section 116, and a first rear end portion 152, which terminates before the second rear end portion 153 at the height position of the second card-accommodating section 117. The relationship of the rear end positions of the first rear end portion 152 and second rear end portion 153 is the reverse of that in the previously described embodiment. A first screw-fastening section 155 having a screw-accommodating hole 155*a* is located toward an outer end of each arm member 112, 113. A second screw-fastening section 157, which includes a screw-accommodating hole 157*a*, and a pin-fastening section 156, which includes a pin-accommodating hole 156*a*, are similarly disposed on the second rear end portion 153, which protrudes beyond the first rear end portion 152. The pin-accommodating hole 156*a* is positioned in the vicinity of the first rear end portion 152. Furthermore, protruding rib 171 is located on an end of the second rear end portion 153, and a groove 172, which extends in the direction of height, is located in an end of the first rear end portion 152. Meanwhile, protruding members 122 are similarly located on the connector member 111; each of the protruding members 122 has a first portion 123, which terminates at the height position of the first card-accommodating section 116, and a second portion 124, which protrudes further. A pin-accommodating section 125, which includes a pin-accommodating hole 125a, and a screw-fastening section 126, which includes a screw-accommodating hole 126a, are disposed on the second portion 124. Furthermore, a slot 162 is located in the end of the first portion 123, and a protruding rib 161 is located on an end of the second portion 124.

The arm members 112, 113 and the connector member 111 are positioned so that the second rear end portions 153 and second portions 124 overlap; in this case, the protruding ribs 161 engage with the grooves 172, and the protruding ribs 171 engage with the slots 162. Next, the arm members 112, 113 are temporarily held to the connector member 111 by accommodating pins (not shown) so that the pins pass through the pin-accommodating holes 125a. Afterward, screws used for fastening the assembly to the circuit board are accommodated in the screw-accommodating holes 126a, 157a, 155a of the screw-fastening sections 125, 155, 157, and the connection of the arm members 112, 113 with the connector member 111 is insured by the firm fastening of these parts to the circuit board by means of these screws.

The main difference between the card connector 110 and the card connector 10 is that one arm member 112 of the card connector 110 contains an ejection mechanism used for card ejection. The construction of this mechanism will be described in detail with reference to FIGS. 8 and 9.

As shown in FIG. 9, section 112a is an integral part of the arm member 112. As shown in FIG. 9b, grooves 158a, 158b which correspond respectively to the first and second card-accommodating sections 116, 117 are located inside of vertical wall 140 in order to guide the accommodation of the cards. Furthermore, section 112a is a horizontal extension 180, which extends in a horizontal direction from a height position that is intermediate between the first and second card-accommodating sections 116, 117 in the direction of height, is disposed on an outside wall 140. As shown in FIG. 8, a generally heart-shaped cam groove 181 is located in surface 180a of the horizontal extension 180. Although not shown, the opposite surface 180b of the horizontal extension 180 also includes a cam groove 181 which has a shape that is symmetrical with the cam groove 181 in the surface 180a. As will be described later, the cam grooves 181 extending along the surfaces 180a, 180b form parts of an ejection mechanism which is used to eject cards respectively accommodated in the first and second card-accommodating sections 116, 117.

First, as shown in FIG. 10a, a metal ejection bar 191 is installed on the arm member 112 in the direction of length thereof along the vertical wall 140 so that metal ejection bar 191 is free to slide therealong. As shown in FIGS. 10a, 10b, a claw 141 which prevents the ejection bar 191 from slipping out is disposed on the arm member 112. Next, the operating members 145 are attached to the respective surfaces 180a, 180b of the horizontal extension 180. Although not shown, the operating members 145 are attached to and spring-biased by frame member 143 (see FIG. 8) prior to being attached to the arm member 112. Each of the operating members 145 has an operating section 146, which is made of a resin, a base section 147, which is a metal plate that is connected to the operating section 146, and a movable section 148, which is attached to the base section 147 so that this movable section 148 can pivot or swing in a horizontal direction. The movable section 148 includes an engaging shoulder 148b, which is engagable with an end of the ejection bar 191 when the operation that ejects a card is performed. End 148a of the movable section 148, which is spaced from pivoting or swinging center C of the movable section 148, is positioned so that end 148a is spring-biased in the direction away from the base section 147 by a plate spring 149, which is attached to the base section 147. Furthermore, the operating section 146 has a projection 195 that protrudes in a direction away from the base section 147. Posts 196, 197, which protrude in the same direction as the projection 195, are respectively disposed at the position of the pivoting or swinging center C and at the end 148a.

Meanwhile, in addition to the cam grooves 181, first and second linearly extending grooves 182, 183 are located in the respective surfaces 180a, 180b of the horizontal extension 180. When the operating members 145 are attached, the cam grooves 181 accommodate the posts 197, and the first grooves 182 and second grooves 183 respectively accommodate the projections 195 and the posts 196. As a result of the engagement of the projections 195 with the first grooves 182 and the engagement of the posts 196 with the second grooves 183, the operating members 145 are guided and allowed to slide with respect to the arm member 112. When the operating members 145 are slide-operated, the posts 197 are guided along the cam grooves 181; accordingly, the movable sections 148 to which the posts 197 are fastened are caused to pivot or swing by the movement of the posts 197. Heart-shaped cam grooves 181 constitute a universally known construction, which prevent the operating sections 146 of the operating members 145 from protruding from the card connector 110. For example a similar construction is disclosed in Taiwanese Patent Application No. 303945.

An especially important point in the present embodiment is that the horizontal extension 180 is formed as an integral part of the arm member 112. Specifically, the arm member 112 has the grooves 158a, 158b used to form the first and second card-accommodating sections 116, 117 to accommodate cards in a stacked configuration and the horizontal extension 180 for mounting the ejection mechanism thereon; accordingly, the manufacturing cost is inexpensive. Furthermore, after the arm member 112 has been completed by attaching the operating members 145 thereto, assembly of the main parts of the card connector 110 can be completed by attaching the arm member 112 to the connector member 111 along with the arm member 113. Accordingly, the number of assembly processes required is small, and assembly can easily be accomplished.

In the card connector of the present invention, at least one connecting means for connecting the arm members and the connector member, which is installed in the area of connection between the arm member and connector member, is formed as a screw-fastening means for fastening to the circuit board. Accordingly, since there is no need for a separate means used to accomplish strong fastening between the arm members and the connector member, the card connector can be made relatively compact. Furthermore, since the arm members and the connector member are screw-fastened, there is no danger that the connection between the arm members and the connector member will come undone following mounting on the circuit board, or that looseness will take place between the respective members.

Furthermore, in the card connector of the present invention, the connector member and the pair of facing arm members respectively form portions of the two card-accommodating sections by means of single members, and ejection mechanisms corresponding respectively to the two card-accommodating sections are attached to one of the pair of facing arm members. Accordingly, a card connector equipped with an ejection mechanism can be realized using a minimal number of parts, and the assembly of the card connector can also be easily accomplished.

What is claimed is:

1. A card connector for mounting on a circuit board, comprising:
    a connector member including a housing and protruding members;
    electrical contacts mounted in the housing for electrical connection to a card;
    arm members having card-guiding grooves for guiding the card therealong; and,
    fastening sections provided on overlapping portions having protruding members, inner ends and outer ends of the arm members for receiving fastening members that extend through the fastening sections and into the circuit board thereby mounting the card connector onto the circuit board.

2. A card connector as claimed in claim 1, wherein the fastening sections have screw-fastening sections provided with screw-accommodating holes in which the fastening members in the form of screws are disposed.

3. A card connector as claimed in claim 1, wherein the overlapping portions include pin-fastening sections having pin-accommodating holes in which pins are disposed.

4. A card connector as claimed in claim 1, wherein the overlapping portions have ribs, and slots in which the ribs are disposed.

5. A card connector as claimed in claim 1, wherein the connector member and the arm members have upper and lower card-accommodating sections for receiving a memory card in each thereof.

6. A card connector as claimed in claim 5, wherein one of the arm members includes an extension, and ejection mechanisms are mounted on one of the arm members along the extension.

7. A card connector for mounting on a circuit board, comprising
    a connector member including a housing and protruding members having guide grooves;
    electrical-contacts mounted in the housing for electrical connection to a card;
    arm members having card-guiding grooves therealong;
    interengaging fastening sections provided by the protruding members and inner ends of the arm members; and
    means provided by the interengaging fastening sections for receiving fastening members that extend through the interengaging fastening sections to secure the arm members and the protruding members together and into the circuit board thereby aligning the guide grooves and card-guiding grooves and mounting the card connector onto the circuit board.

8. A card connector as claimed in claim 7, wherein the interengaging fastening sections include pin-fastening sections having pin-accommodating holes in which pins are disposed.

9. A card connector as claimed in claim 7, wherein the connector member and arm members have upper and lower card-accommodating sections for receiving the card in each thereof.

10. A card connector as claimed in claim 7, wherein the interengaging fastening sections comprise overlapping portions provided by the protruding members and the inner ends of the arm members.

11. A card connector as claimed in claim 10, wherein the overlapping portions have ribs and slots in which the ribs are disposed.

12. A card connector as claimed in claim 10, wherein outer ends of the arm members include fastening sections.

13. A card connector as claimed in claim 12, wherein the means for receiving fastening members comprise screw-accommodating holes in which the fastening members in the form of screws are disposed.

* * * * *